United States Patent [19]

McCallie

[11] Patent Number: 4,912,459
[45] Date of Patent: * Mar. 27, 1990

[54] DETECTION OF LIGHTNING, STORMS AND THE LIKE

[76] Inventor: James A. McCallie, P.O. Box 946, Land O'Lakes, Fla. 34639

[*] Notice: The portion of the term of this patent subsequent to Apr. 18, 2006 has been disclaimed.

[21] Appl. No.: 338,956

[22] Filed: Apr. 17, 1989

Related U.S. Application Data

[63] Continuation-in-part of Ser. No. 126,063, Nov. 27, 1987, Pat. No. 4,823,115.

[51] Int. Cl.$^4$ ............................................. G01W 1/00
[52] U.S. Cl. ....................................... 340/601; 324/72; 73/170 R
[58] Field of Search ................. 340/601, 602; 324/133, 324/72; 73/170 R

[56] References Cited

U.S. PATENT DOCUMENTS 3,891,919 6/1975 Renninger ............................ 340/601
4,823,115 4/1989 McCallie ............................... 340/601

Primary Examiner—Joseph A. Orsino
Assistant Examiner—Jeffery A. Hofsass

[57] ABSTRACT

Detection of lightning, storms, or the like via sensing means connected between an external antenna and ground, plus alerting means including gate means and indicator means operatively connected to the sensing means. An unpowered cascaded emitter-follower arrangement of at least a Darlington pair of transistors triggers the gate means when lightning-induced or similar fluctuations in ambient electric field cause the sensing transistors to conduct. A pulse-stretcher between the sensing means and the gate means controls the duration of indication and includes a capacitor connected to discharge through a sensing transistor during conduction of the sensing means and to recharge through a gate transistor during actuation of the indicator means. Resistors between the antenna and ground and between the base and the emitter of the respective transistors in the sensing means preclude actuation by fluctuations characteristic of slower-acting phenomena.

20 Claims, 1 Drawing Sheet

DETECTION OF LIGHTNING, STORMS AND THE LIKE

This is a continuation-in-part of my copending patent application, Ser. No. 126,063, filed 27 Nov. 1987, to issue as U.S. Pat. No. 4,823,115 for "Detection of Lightning, Storms, and the Like."

FIELD OF THE INVENTION

This invention relates to detection of lightning, storms, or similar electrostatic phenomena, and to alerting observers thereto.

BACKGROUND OF THE INVENTION

Lightning, storms, and similar electrostatic phenomena have been objects of attention since time immemorial, and devices for alerting observers thereto are numerous and well known. Examples include the "Thunderstorm Warning System" of Lundquist & Scuka U.S. Pat. No. 3,611,365; the "Severe Weather Warning Device" of Downing & McEwen U.S. Pat. No. 3,753,117; and the "Stormscope" of Ryan & Spitzer U.S. Pat No. 4,023,408. However, such devices require power supplies, energized by internal batteries or by leads from an external source, to sense such phenomena as well as to actuate their many and varied components. Moreover, their reception and indication of lightning, etc. utilize radio frequencies and, thus, are subject to RF interference from identifiable and unidentifiable sources, both local and distant. These complications are confusing to observers and undesirable, so my detection devices and methods avoid them.

SUMMARY OF THE INVENTION

In general, the present invention provides means and methods for detecting lightning, storms, and similar electrostatic phenomena with the aid of an exterior antenna and a grounding wire, rod, etc. In particular, sensing apparatus responsive to fluctuating ambient electric field strength is input-connected between the antenna and ground, and is output-connected to alerting means actuated thereby.

A primary object of this invention is to provide apparatus and methods to detect such electrostatic phenomena without requiring an added power source for such detection.

Another object of the invention is to alert nearby observers by audible and/or visible indications of such phenomena without necessity for them to give such apparatus close attention.

A further object of this invention is to vary such alerting indications in accordance with the distance and/or strength of the detected lightning, etc.

Yet another object is to eliminate interference from relatively low-frequency sources of longer periodicity than usual millisecond periods of lightning impulses.

A still further object is to provide probe apparatus containing sensing means of this invention and conveniently mountable outdoors.

Other objects of the present invention, together with means and methods for attaining the various objects, will be apparent from the accompanying diagrams and the following description of a preferred embodiment, presented by way of example rather than limitation.

DETAILED DESCRIPTION

Figure 1:
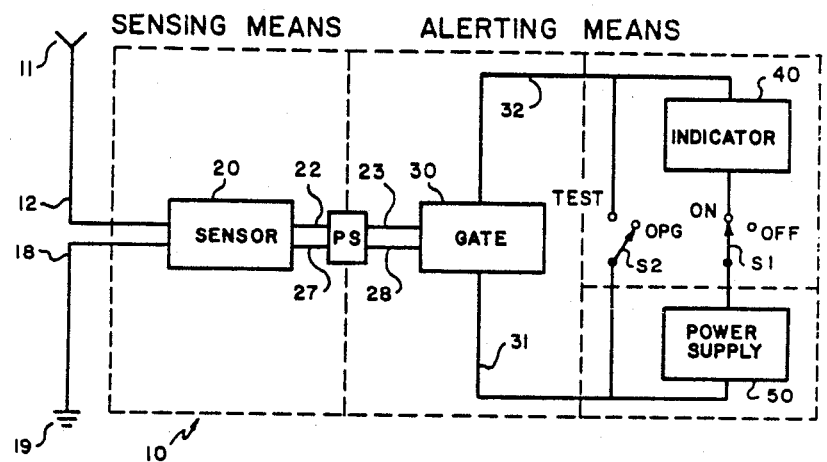
FIG. 1 is a block diagram of apparatus useful according to this invention.

FIG. 1 represents apparatus 10 of this invention, largely in block form. Indicated at the upper left is antenna 11 with lead 12 down from it, and at the lower left is earth ground 19 with lead 18 down to it. Otherwise, this diagram is divided into two main rectangles (broken lines) marked SENSING MEANS (at the left) with a single block therein and ALERTING MEANS (at the right) containing several blocks. Intermediate between the respective means and on the vertical broken line boundary dividing them is PULSE-STRETCHER means PS. Single SENSOR block 20 receives lead pair 12, 18 at the left, and at the right it connects via pair of leads 22, 27 to the PULSE-STRETCHER and then via pair of leads 23, 28 to first or GATE block 30 of the ALERTING MEANS. Upper and lower leads 32 and 31, bridged by battery switch S2 (with OPG and TEST terminals) connect the GATE block to INDICATOR block 40 and to POWER SUPPLY block 50, respectively, with ON/OFF switch S1 between the latter two blocks.

Figure 2:
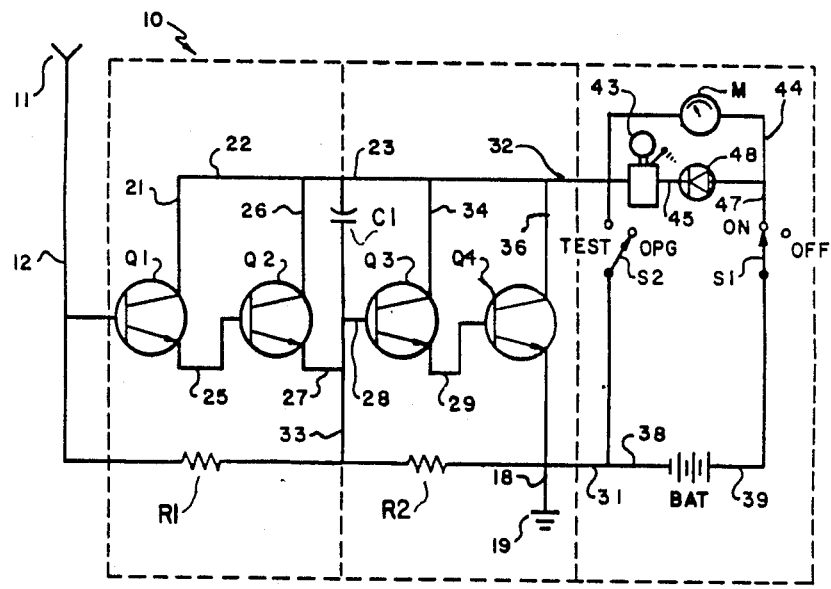
FIG. 2 is a circuit diagram of an embodiment of electrical circuitry of such apparatus.

FIG. 2 illustrates apparatus 10 schematically with emphasis upon electrical circuitry within the blocks of FIG. 1. Though still outlined in broken lines the blocks are not separately identified in this view. A cascaded emitter-follower arrangement of bipolar junction transistors is featured, wherein Q1 and Q2 form a first Darlington pair, with the Q1 emitter connected to the Q2 base by lead 25, and their respective collectors connected together via leads 21 and 26 to common lead 22. Similarly, Q3 and Q4 form a second Darlington pair with the emitter of Q3 connected to the base of Q4 by lead 29, and their collectors interconnected by leads 34 and 36 to common lead 23, which is a continuation of lead 22. The emitter of Q4 is connected to external ground 19 by lead 18. Antenna lead 12, after connecting to the base of Q1 continues to ground via series resistors R1 and R2. Emitter lead 27 of Q2 connects via lead 33 to the junction of resistors R1 and R2, so that R1 bridges the first, and R2 bridges the second Darlington pair.

In FIG. 2, PULSE STRETCHER capacitor C1 is shown connected from the junction of common leads 22 and 23 to the junction of Q2 emitter lead 27 with Q3 base lead 28 and on to the junction of resistors R2 and R3 between the antenna and ground. It is apparent that, as indicated in FIG. 1, this pulse-stretching component lies along the boundary between the SENSING MEANS and the ALERTING MEANS. That boundary coincides with C1 lead 33 (vertical) in FIG. 2.

Also in FIG. 2, the Q4 collector lead 36 is connected to common collector lead 23, which joins lead 32 to audible indicator 43——which is connected in turn to visible indicator 48 by lead 45. The audible indicator is shown in buzzer form, while the visible indicator is shown as a light-emitting diode (LED). Grounded Q4 emitter lead 18 connects to lead 38 to the negative terminal of BAT, a battery to power the indicators when S1 is in the ON position to complete the circuit from BAT lead 39 (from the positive terminal) through lead 47 to the indicators, which are inactive with S1 OFF. Connected in parallel across the indicators via lead 44 is meter M. If manually pressed momentarily to its TEST or closed position, switch S2 (normally in an OPG or open position) connects indicator lead 32 to the junction of Q4 emitter lead 31 and BAT lead 38, as is useful in checking the condition of the battery and the indicators. Leads 31 and 32 are conveniently a twin-wire lead pair of appreciable length (say, five to ten meters) to enable components such as the INDICATOR and the POWER SUPPLY and their associated switches and meter to be located distant from the antenna, preferably indoors.

Figure 3:
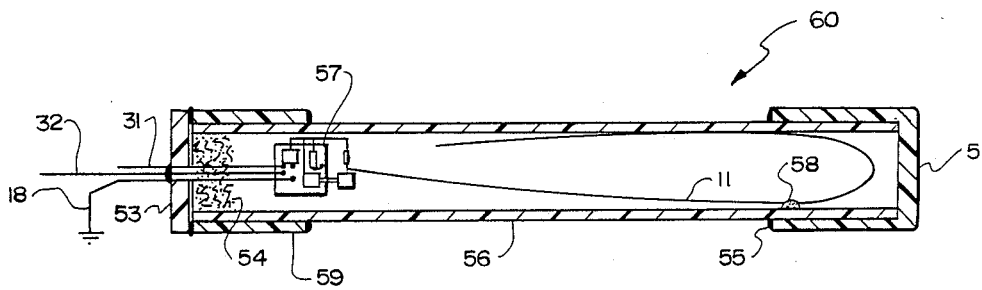
FIG. 3 is a side sectional elevation of sensing probe apparatus embodying sensing means of the preceding views.

FIG. 3 shows in longitudinal sectional elevation cylindrical waterproof probe 60, which contains antenna 11 and associated circuit elements carried on or by circuit board 57 within a surrounding cylindrical housing. The housing is made up of tubular member or pipe 56 capped at its far (right) end by cuplike end cap 51 and at its near (left) end, which is surrounded by reinforcing collar 59, in the form of a short close-fitting length of tubing, and is closed by annular plate 53 such as is sometimes used as a pipe plug. Leads 18, 31, and 32 emerge from the interior of the housing to the exterior, via the central bore. The assembled parts of the housing are sealed by a bead of sealant 55 along their various junctions. A drop of glue 58 inside the housing close to the far end spot-welds a short segment of antenna wire 11 to the inside wall of pipe 56, and the further reach of antenna wire (after curving through a half circle) terminates near the circuit board. A similar spot of glue is useful in sealing the opening in the end plate where several leads emerge, as already noted. Wad 54 of non-conductive filamentary material, such as glass fibers, in the near end portion of the pipe is useful in shielding the interior components from moisture.

Circuit board 57 in FIG. 3, carries the aforementioned transistors, capacitor, and resistors, represented as unnumbered members too small to be readily visible on the illustrated scale. Included are square members, one (at the upper left) being pulse-stretching capacitor C1. At the lower right of the circuit board are two similar squares, one superimposed on the board and the other off the edge to the right, respectively comprising pairs of bipolar junction transistors, such as Q1–Q2, with leads, on the one hand, and Q3–Q4 with leads on the other hand. It has been found desirable to support the Q1–Q2 pair off the board by their leads to avoid condensation of moisture between the Q3 base and collector—and consequent flow of a small but disturbing current. Resistors R1 and R2 appear as smaller rectangles.

Both installation and operation of the preferred apparatus embodiment, just described, are readily understood in the light of the prior description and the accompanying drawing figures. However, a few comments about the phenomena to be detected by the apparatus may aid that understanding, as by distinction from other phenomena of interest and detectable by other means and methods. It should be understood that, to whatever extent these comments are theoretical, they may be disregarded as not affecting the practical performance of the apparatus of this invention——which itself knows no theory.

Lightning is a natural accompaniment of thunderstorms and is familiar to everyone, but its complexity is formidable. Featured is a high-voltage electrical discharge along a pathway often a couple miles long in the earth's atmosphere. Storms characterized by strong convective currents tend to produce along the cloud base broad areas of negative charge. Such charged area repels normal negative charges in the ground and produces a gradient or difference in electrical potential, which may reach millions of volts, between the cloud base and the ground. High potential differences are conducive to electrical discharges, visible as lightning. Such discharges often start with a negatively charged leader or "step" stroke, progressing down from the cloud at normal automotive highway speed or faster. Positively charged "streamers" rise from the earth or from upstanding projections, such as buildings, poles, and trees. Often within about ten meters above the earth's surface the two connect and produce a powerful surge of current, such as thousands or tens of thousands of amperes. Much radio-frequency "noise" results.

Concurrently, voltage impulse waves occur and radiate outward in all directions along the surface of the earth, positively charged above, and negatively charged below, the ground surface. Such a radiating waves induce voltages in objects located in its path of travel and actuate my detection apparatus upon reaching its antenna.

The antenna may be strung horizontally above the ground at a height of a couple meters, for example, with the circuit board and attached circuit elements housed safely indoors. Preferably though, an antenna probe as described above is used to house the board and circuit elements——other than those in the ALERTING MEANS, which may be mounted conveniently in a conventional chassis (not shown). Reinforcing collar 59 enables a clamp (not shown) to be compressed about the probe housing to secure it in position, whether upright as on a pole or mast or otherwise. Of course, a grounding rod is driven into the earth, preferably in the vicinity, so that the described apparatus is interposed between antenna and ground.

Bipolar transistors, such as those in the apparatus of this invention, exhibit a characteristic known as barrier potential, an internal base-emitter junction voltage, such as some tenths of a volt, coresponding to an internal impedance of some hundreds of megohms, precluding conduction until overcome by a contrary voltage impressed upon the base from the outside. In my apparatus resistors R1 and R2 reduce base input impedance to about 20 megohms at Q1 and filter out voltage fluctuations at frequencies below a couple hundred Hertz. Radio-frequency waves are in the micro-volt range at such distances, a couple magnitudes below lightning-caused earth surface waves.

Although no electrical power is needed to actuate the sensor transistors, which are actuated from the applied earth wave voltage, power is required for the audible and visible indicators, so the apparatus is conveniently turned ON and left ON, especially as it draws no current unless the transistors are externally actuated as already described. When switch S1 is turned ON, a momentary current flow charges capacitor C1, but there is no other current requirement until lightning or the like is detected.

When an earth wave pulse, usually a few milliseconds long, is received at the antenna it is impressed across R1 between the base and emitter of Q1, overcoming the barrier potential. The very large input impedance of Q1 is reduced by such biasing, whereupon a small current flows through it. By reason of the emitter-follower connection of Q1 and Q2, the Q2 base is biased more than Q1 was, whereupon a greater (amplified) conduction occurs through Q2. At Q3 and Q4, the progressive lowering of resistance causes base current to flow therein, greatly lowering the internal resistance thereof. This enables or "gates" large current flow between the Q4 collector and emitter from the battery and, thus, through the indicators in series with it, actuating them to alert persons nearby to hear the sound and/or to see the light of the audible and/or visible indicators.

Conduction through Q2 enables C1 to discharge through Q2. Thereupon a recharging current flows back from the Q4 emitter to its base and via lead 29 to Q3's emitter and out through its base to C1. Q3 and Q4 conduct as long as such recharging current is flowing.

In practice, switched ON, a distant lightning discharge momentarily sounds the audible (buzzer) indicator and blinks the visible (LED) indicator. As the lightning gets closer, the sound gets louder until the lightning is close enough to fully sound the buzzer and cause the LED to flash brightly for each lightning discharge. With a C1 value of 0.047 microfarad, when the lightning is a hundred miles or so away, the buzzer sounds and the LED lights for about a quarter second and the meter needle deflects momentarily, whereas if the lightning is within about 35 miles the buzzer will sound loudly and the LED light for about 2 seconds, and the meter deflect higher.

Other electrostatic field phenomena subject to sensing by such apparatus and method, to the extent that they might interfere with the rapid fluctuations characteristic of lightning, are intentionally filtered out, including both the formation and the dissipation of meteorological charge carriers, such as rain, fog, and physical contact of rain against the antenna and surges of cold (positively charged) air from the upper reaches of a thunderstorm.

The components of apparatus for practicing the method of this invention are all readily available. Single integrated chips, ECG 172A, provide Darlington pairs of bipolar transistors: Q1-Q2, Q3-Q4 (one pair each). Resistors R1 and R2 are on the order of tens of megohms each, conveniently 10 megohms. Capacitor C1 may be a fixed value in the nanofarad range (the exemplified value is 47 nF) or may be as small as ten picofarads or as large as a microfarad, depending on how short or long the operator wishes to actuate the indicators. C1 may be value-adjustable for convenient resetting by the operator. A 9-volt dry battery is used to actuate suitable indicators, and their ON/OFF switch is conveniently a toggle switch, whereas the BAT TEST switch is a push-button biased to the open position. The antenna is a copper wire up to about a meter in length, conveniently 60 cm. In the probe, polyvinyl chloride (PVC) is suitable for the tubular components, cap, and base plate, as are many other electrically non-conductive materials. Selection of other, equivalent components is well within the capability of ordinarily skilled persons, with the present specification as a guide to the desired objectives.

Advantages and benefits of this invention are apparent. No power source is needed to actuate the detection or sensing means for a close observer. A not-too-attentive observer has the added convenience of being alerted by a loud or bright attention-getting indication. RF interference is no problem as it is in conventional equipment reactive to such emanation from storms, lightning, etc.

This invention enables other unpowered sensing, such as detection of thunder with a piezoelectric transducer between the base of Q1 and ground. Other modifications may be made in the inventive apparatus or method, as by adding, combining, or subdividing parts or steps, while retaining some of the advantages and benefits of the present invention—which itself is defined in the following claims.

I claim:

1. In apparatus adapted to detect lightning, storms, or like electrostatic phenomena via an exterior antenna and a ground wire, the improvement comprising
   unpowered non-conducting bipolar junction sensing means connected between the antenna and ground and adapted to
   conduct upon sensing fluctuating ambient electric field strength;
   alerting means actuated by such sensing means; and
   pulse-stretching means between such sensing and alerting means.

2. Detection apparatus according to claim 1, wherein the sensing means includes a bipolar sensing transistor and a resistor connected between the antenna and ground and connected also between the base and the emitter of such transistor.

3. Detection apparatus according to claim 1, wherein the
   alerting means includes power supply means and indicator means, and includes also gate means interposed between the sensing means and the indicator means.

4. Detection apparatus according to claim 3, wherein the gate means includes a bipolar gate transistor, and the pulse-stretching means includes a capacitor
   connected between the sensing means and gate means so as to discharge through a sensing transistor during
   sensing of such a fluctuating electric field and to recharge through a gate transistor during actuation of the indicator means.

5. In apparatus adapted to detect lightning, storms, or like electrostatic phenomena via an exterior antenna and a ground wire, the improvement comprising
   unpowered non-conducting bipolar junction sensing means connected between the antenna and ground and adapted to conduct upon sensing fluctuating ambient electric field strength;
   resistor means connected between the antenna and ground and connected at the input to such bipolar junction sensing means,
   alerting means including gate means responsive to conduction in the sensing means and adapted to actuate and power-energized indicator means.

6. Detection apparatus according to claim 5, wherein the sensing means includes a plurality of bipolar transistors in a cascaded emitter-follower arrangement, and
   the gate means includes bipolar junction transistor gate means.

7. Detection apparatus according to claim 6, wherein the sensing means has the first transistor therein with its base connected to
   the antenna, and its emitter connected through a resistor to ground; the second transistor therein with its base connected to the antenna, and its emitter connected through a resistor to ground; and the gate means includes a plurality of bipolar transistors in a cascaded emitter-follower arrangement, and has the first transistor therein with its base connected to the emitter of the last transistor in the sensing means, and the second transistor therein with its emitter and collector connected across indicator means in series with a battery powering such indicator means.

8. Detection arrangement according to claim 7, including pulse-stretching means connected between the second transistor in the sensing means and the first transistor in the gate means.

9. Detection arrangement according to claim 8, wherein the pulse-stretching means includes a capacitor connected to discharge through the second transistor in the sensing means during sensing of such fluctuation in electric field strength, and to recharge through the first transistor in the gate means during actuation of the powered indicator means.

10. In apparatus including both an exterior antenna and a ground connection, for detecting fluctuating electric fields propagated by lightning, storms, or like electrostatic phenomena, the combination of sensing means in the form of an emitter-follower arrangement of bipolar transistors including an unpowered Darlington pair,
with the base of the first transistor in such pair connected to the antenna, and
with the emitter of such transistor connected to ground through the second such transistor; an
a first resistor, connected
between the antenna and ground and also
between the base of the first transistor and the emitter of the second transistor;
being thereby conductive when such first transistor senses such a fluctuation in ambient electric field strength.

11. Detection apparatus according to claim 10, including a second resistor, connected in series between the first resistor and ground.

12. Detection apparatus according to claim 11, including gate transistor means adapted to conduct whenever such sensing means transistors conduct, and
power source means and powered indicator means adapted to be placed in series circuit upon conduction through the gate transistor means to energize the indicator means.

13. Detection apparatus according to claim 12, wherein the gate transistor means including a second Darlington pair, of bipolar transistors in an emitter-follower arrangement
with the base of its first transistor connected to the emitter of the second transistor in the sensing means and
with the emitter of its second transistor connected to ground.

14. Detection apparatus according to claim 13, including a capacitor connected between the sensing means and the gate means, and thereby adapted
to discharge through the second transistor in the sensing pair during sensing of such fluctuating electric field, and
to recharge through the first transistor in the gate pair during energization of the indicator means.

15. Detection apparatus according to claim 12, wherein such fluctuations at less than a couple hundred Hertz are filtered out by the resistors so connected between antenna and ground.

16. Electronic lightning-detection apparatus comprising unpowered bipolar transistor means comprising more than one Darlington pair connected in sequential emitter-follower arrangement and thereby adapted to sense lightning as far away as several hundred miles, and
powered indicator means triggerable by the transistor means and adapted to indicate the distance of sensed lightning by an observable characteristic of such indications.

17. In a method for detecting fluctuating electric fields propagated by lightning, storms, or like electrostatic phenomena, including using both an exterior antenna and a ground connection, the steps of arranging a plurality of Darlington pairs in an unpowered emitter-follower arrangement,
with the base of the first such transistor connected to the antenna, and with the emitter of the second such transistor connected to ground through a first resistor; and thereby
filtering out fluctuations of undesirably low frequency.

18. Detection method according to claim 17, including connecting a second resistor across the base of the first transistor and the emitter of the second transistor, both of such transistors being in the second such Darlington pair
actuating indicating means when conduction occurs.

19. Detection method according to claim 18, wherein the second Darlington pair comprises gate means adapted to connect a power source to indicator means and thereby energizing such indicator means, including connecting a capacitor across the collector and the emitter of the second transistor in the first pair and across the base and the collector of the first transistor in the second pair, and
discharging the capacitor through such second transistor during sensing of such fluctuations and recharging the capacitor through such first transistor from such power source during such actuation of the indicating means.

20. Detection method according to claim 19, including connecting such capacitor from the junction of the collector of the second transistor in the first pair and the collector of the first transistor in the second pair, past the junction of the emitter of such second transistor to the base of such second transistor to the junction of the first such resistor to the second such resistor.

* * * * *